US008432098B2

(12) United States Patent
Froehlich et al.

(10) Patent No.: US 8,432,098 B2
(45) Date of Patent: Apr. 30, 2013

(54) LIGHTING DEVICE FOR A MOTOR VEHICLE

(75) Inventors: Thomas Froehlich, Reutlingen (DE);
Jochen Mehl, Holzgerlingen (DE);
Christian Johann, Reutlingen (DE);
Matthias Roder, Reutlingen (DE);
Franco Marcori, Moggio Udinese (IT);
Alain Bosero, San Daniele Del Friuli (IT)

(73) Assignee: Automotive Lighting Reutlingen GmbH (DE)

( * ) Notice: Subject to any disclaimer, the term of this patent is extended or adjusted under 35 U.S.C. 154(b) by 422 days.

(21) Appl. No.: 12/764,519

(22) Filed: Apr. 21, 2010

(65) Prior Publication Data
US 2010/0270929 A1 Oct. 28, 2010

(30) Foreign Application Priority Data
Apr. 22, 2009 (DE) .......................... 10 2009 018 448

(51) Int. Cl.
*B60Q 1/02* (2006.01)
(52) U.S. Cl.
USPC .............. 315/82; 315/327; 315/349; 362/459
(58) Field of Classification Search .............. 315/76–77, 315/82, 326–327, 349; 362/263–264, 294, 362/345, 459, 507; 313/13, 113, 547, 549, 313/608
See application file for complete search history.

(56) References Cited

U.S. PATENT DOCUMENTS

| | | | | |
|---|---|---|---|---|
| 5,428,261 A | * | 6/1995 | Wittig et al. | 313/318.1 |
| 6,031,323 A | * | 2/2000 | Behr et al. | 313/318.01 |
| 6,084,354 A | * | 7/2000 | Kohmura et al. | 315/57 |
| 6,124,673 A | * | 9/2000 | Bishop | 315/56 |
| 6,404,132 B1 | * | 6/2002 | Krumholz | 315/82 |
| 6,462,476 B1 | * | 10/2002 | Hirschmann et al. | 315/58 |
| 7,135,822 B2 | * | 11/2006 | Behr et al. | 315/57 |
| 2002/0057058 A1 | * | 5/2002 | Honda et al. | 313/578 |
| 2004/0120148 A1 | * | 6/2004 | Morris et al. | 362/264 |
| 2005/0104524 A1 | * | 5/2005 | Bishop | 315/56 |
| 2006/0119282 A1 | * | 6/2006 | Hackenbuchner et al. | 315/209 R |
| 2007/0145915 A1 | * | 6/2007 | Roberge et al. | 315/312 |
| 2008/0214023 A1 | * | 9/2008 | Hackenbuchner et al. | 439/56 |
| 2009/0122557 A1 | * | 5/2009 | Pruss | 362/307 |

* cited by examiner

*Primary Examiner* — Jason M Crawford
(74) *Attorney, Agent, or Firm* — Donald R. Boys; Central Coast Patent Agency, Inc.

(57) ABSTRACT

The invention relates to a lighting device for a motor vehicle. Said lighting device comprises a gas discharge lamp (1; 96) for emitting light, a starting device for providing a starting voltage for starting the gas discharge lamp (1; 96) and a control device for providing an input voltage for the starting device and an operating voltage for operation of the gas discharge lamp (1; 96). The control device is an integral part of the starting device. In order to come to grips with the problems associated with space and temperature with such lighting devices, the invention proposes that the combined starting and control device (5; 80) has a plug element (6) for connecting a vehicle power supply system voltage (7), the plug element (6) being in the form of a printed circuit board plug, which is formed by conductor tracks (21; 23) guided at an edge of a printed circuit board (20) of the starting and control device (5; 80).

7 Claims, 10 Drawing Sheets

LIGHTING DEVICE FOR A MOTOR VEHICLE

The present invention relates to a lighting device for a motor vehicle, comprising a gas discharge lamp, a starting device and a control device or ballast. The gas discharge lamp emits light which is visible to the human eye. The starting device provides a starting voltage for starting the gas discharge lamp. The control device is used for providing an input voltage for the starting device and an operating voltage for operation of the gas discharge lamp. These voltages are generated by the control device from the vehicle power supply system voltage of the motor vehicle. The control device is an integral part of the starting device.

Such a lighting device is known from DE 35 19 611 A1. In this case, a combined starting and control device is arranged on the rear side of the reflector. Through an opening in the reflector, contact is made between a gas discharge lamp which is arranged in the interior of the reflector and the starting and control device, and said gas discharge lamp is fastened to said starting and control device at least indirectly. Inter alia, the space which is required for the combined starting and control device has proved to be problematic when using combined starting and control devices for gas discharge lamps in lighting devices. Since the space which is available in the interior of the housing of the lighting device is limited, until now lighting devices of the type mentioned at the outset have not found widespread use in practice. A further problem is the considerable development of heat in the interior of the housing of the lighting device. This is firstly due to the operation of the gas discharge lamp and secondly due to the electronic components of the starting and control device. The high temperatures in the vicinity of the starting and control device can result in premature ageing and ultimately in failure of the electrical components of the starting and control device. Or else it is necessary to use relatively expensive components which withstand relatively high temperatures without any impairment in terms of function over a relatively long period of time.

Furthermore, gas discharge lamps with a more recent design with a starting device as an integral part of the gas discharge lamp of the type D1 or D3 are known from the prior art. Such gas discharge lamps are generally used in so-called projection modules in motor vehicle headlamps. In this case, the projection module is arranged either on its own or together with other light modules (projection module or reflection module) in a housing of the headlamp. In the light exit direction, the housing has a light exit opening which is closed by a transparent cover plate. The cover plate is preferably in the form of a pane of clear glass, i.e. without any optically effective elements such as prisms or cylindrical lenses, for example. However, it is of course also conceivable for the cover plate to have optically effective elements which bring about diffusion of the light passing through.

In addition to the gas discharge lamp, a projection module comprises a reflector for focusing the radiation emitted by the lamp and a projection lens for imaging the focused radiation on a roadway in front of the motor vehicle in order to generate a desirable light distribution. If the light distribution is intended to have a horizontal light-dark boundary, in addition a diaphragm arrangement is also arranged in the beam path between the reflector and the projection lens, said diaphragm arrangement shielding at least some of the reflected radiation. In order to generate the desirable light distribution with the horizontal light-dark boundary, the upper edge of the diaphragm arrangement is projected by the projection lens onto the roadway in front of the motor vehicle as the light-dark boundary. The diaphragm arrangement can be designed to be integral or else have a plurality of diaphragm elements which are capable of being moved relative to one another, it being possible for the position and/or profile of the diaphragm upper edge to be varied by virtue of the movement of the diaphragm elements relative to one another. In this way, an adaptive light distribution can be achieved.

Of course the use of gas discharge lamps with an integrated starting part is possible not only in projection systems, but also in reflection systems. In the case of these reflection systems, the desired light distribution is achieved without a projection lens and generally also without a diaphragm arrangement merely by virtue of a suitable shape of the reflector. Optically effective profiles on the cover plate of the lighting device, which cover plate is arranged in the beam path, can, if provided, bring about diffusion of the reflected light beams in particular in the horizontal direction and to a certain degree also in the vertical direction.

A gas discharge lamp has a glass bulb, in which a noble gas, for example xenon, is contained as the fill. The precise composition of the fill of gas discharge lamps varies from lamp manufacturer to lamp manufacturer. In order to generate light, an arc is established in the noble gas and maintained. An integral part of the known gas discharge lamps, as has been mentioned, is a starting device, which has the circuit electronics required for starting the gas discharge lamp, i.e. for initiating the arc in the noble gas. A control device which is separate from this is generally arranged externally on the housing of the lighting device. The control device operates and monitors the lamp; it generates an intermediate voltage (approximately 1000 volts) as the input voltage of the starting device from the vehicle power supply system voltage, and the input voltage is then transformed up by the starting device into the starting voltage (approximately 25 000 volts), and an operating voltage for the continuous operation of the lamp once the arc has been struck. In addition, the control device instructs the starting device to start the gas discharge lamp; it controls the current feed in the run-up phase in the case of a cold lamp and provides power-regulated supply to the lamp during steady-state operation. In addition, the control device can to a large extent compensate for fluctuations in the vehicle power supply system voltage. If the lamp is extinguished for example owing to an extreme voltage dip in the vehicle power supply system, the control device instructs the starting device immediately and automatically to restart the lamp.

There are various reasons for the separate arrangement of the control device. One reason is the problems associated with space in the interior of the housing of the lighting device. By virtue of the separate configuration of the control device said control device can be arranged at virtually any desired point externally on the housing of the lighting device, depending on the size and shape of the installation space for the lighting device provided in the motor vehicle. That is to say that it is possible to respond in any flexible manner to the installation space in the vehicle for the lighting device, which installation space varies from vehicle type to vehicle type, and to arrange the control device at a suitable point. A further reason can be considered to be the relatively high operating temperatures in the region of approximately 150° C. in the interior of the housing of the lighting device in the vicinity of the light source. The temperatures externally on the housing of the lighting device are markedly lower and are approximately in the region of 100° C. Thus, component parts can be used for the control device which are less heat-resistant and therefore also are more favorable in terms of the acquisition thereof. The starting device and the separate control device are connected to one another via a shielded line. The shielding of the line is required in order to be able to adhere to the requirements placed on the electromagnetic compatibility (EMC) in the motor vehicle.

Overall, in the case of the lighting devices known from the prior art with gas discharge lamps and a separately arranged control device, there is the disadvantage that additional installation space for the control device which is arranged outside of or on the housing of the lighting device needs to be available in the motor vehicle. In addition, the mounting of the known lighting device is relatively involved since, in addition to the mounting of the light module with the gas discharge lamp and the starting device in the housing of the lighting device, in addition the control device also needs to be arranged outside of the housing and contact needs to be made between said control device and the starting device in a separate working step.

This results in an involved fitting procedure, which takes up a considerable amount of time and is also expensive. A further problem consists in the costs of the shielded line between the starting device and the control device.

Against the background of the described prior art, the present invention is based on the object of designing and developing a known lighting device to the extent that, despite the fact that the starting device and the control device are integrated in a single combination device arranged on the rear side of the reflector, the practical suitability of the gas discharge lamp with the combined starting and control device is improved. In particular, the lighting device which is equipped with such a gas discharge lamp is intended to be designed to be as small as possible and also to operate with a high degree of reliability over a long period of time at relatively high temperatures.

In order to achieve this object, against the background of the lighting device of the type mentioned at the outset, the invention proposes that the combined starting and control device has a plug element for connecting a vehicle power supply system voltage, the plug element being in the form of a printed circuit board plug, which is formed by conductor tracks guided at an edge of a printed circuit board of the starting and control device.

The gas discharge lamp of the lighting device according to the invention comprises a lamp base, from which, on one side, the glass bulb with the noble gas contained therein extends, and on the opposite side of which a combined starting and control device is arranged. The starting device which is fastened to the base of the gas discharge lamp is supplemented by the functionality of the control device. As a result, the control device no longer needs to be arranged outside of the housing of the lighting device or externally on the housing of the lighting device, but is accommodated in the interior of the starting device housing. The installation space in the motor vehicle which is required for the control device which is arranged externally on the housing of the lighting device is therefore no longer required. The installation space which is required in the motor vehicle for the installation of the lighting device can also be reduced. In the case of the lighting device with the combined starting and control device, the shielded electrical line between the control device and the starting device for transmitting the input voltage of the starting device from the control device is therefore likewise no longer required.

The combined starting and control device can transform up the vehicle power supply system voltage (12 volts, 24 volts or 42 volts) either in one go or in a plurality of stages (for example initially to 1000 volts and then to 25 000 volts) to the starting voltage required for striking the arc. During steady-state operation of the gas discharge lamp, the combined starting and control device then switches the voltage present at the light source over to the operating voltage, which is markedly lower than the starting voltage.

By virtue of the proposed configuration of the plug-type element of the combined starting and control device of the lighting device according to the invention, space can be saved in the interior of the housing of the combined starting and control device, since a separate printed circuit board plug, which is intended to be fastened on the printed circuit board and with which contact is intended to be made, is no longer required. Instead, a peripheral region of the printed circuit board is formed so as to realize the plug-type element function, without additional component parts being required for this purpose. The plug, which is in the form of an integral part of the printed circuit board, has at least two contacts for the two poles of the vehicle power supply system voltage. Optionally, the plug can also have one or more contacts for connecting drive and/or signal lines. A superordinate motor vehicle control device, for example, can communicate and exchange information with the combined starting and control device via a drive/signal line. Firstly, drive information can be transmitted from the motor vehicle control device to the starting and control device (for example a signal "light on" or "light off"), and secondly feedback can be transmitted from the starting and control device to the superordinate control device (for example a signal "lamp functional" or "lamp defective"). In accordance with the invention, therefore, the plug-type connector with respect to the starting and control device inputs and outputs is in the form of a printed circuit board plug, with the contacts of the plug ("male part") being formed by conductor tracks on the printed circuit board. The mechanical connection to the socket part ("female part") can be ensured by appropriate milled portions in the printed circuit board contour.

In accordance with an advantageous development of the invention, the combined starting and control device is an integral part of the gas discharge lamp and is connected undetachably thereto. In similar fashion to the D1 and D3 lamps known from the prior art, the starting and control device in the case of the light source of the lighting device according to the invention is therefore fastened fixedly on that side of the lamp base which is opposite the glass bulb.

In accordance with a preferred embodiment of the invention, it is proposed that the combined starting and control device has a housing made from metal, in which all of the electrical components for performing the starting device function and the control device function are accommodated. For improved EMC shielding, the housing is made from metal, for example aluminum.

Advantageously, the combined starting and control device has a multilayered printed circuit board, and electronic components of the starting and control device circuit are accommodated in interlayers of the printed circuit board. By virtue of this integration of electronic components in one or more interlayers of the printed circuit board, more components per unit area, based on a given printed circuit board area, can be accommodated than in conventional single-sided printed circuit boards, as have been used to date for control devices and starting devices for gas discharge lamps. The electronic components are preferably in the form of integrated circuits (without a dedicated housing, only the silicon chip), capacitors and/or resistors. The electronic components can also be other active electronic components, such as transistors and diodes.

In accordance with another preferred embodiment of the invention, it is proposed that the combined starting and control device has a printed circuit board, and transformer and inductance windings are mounted in supported and helical fashion on the printed circuit board or are embodied as conductor tracks on the printed circuit board. In accordance with this embodiment, therefore, the transformer and inductance windings are integrated in the circuit board or the conductor track layer thereof and are not in the form of separate electronic components used for populating the printed circuit board (arrangement of the component on the printed circuit board, mechanical fastening of the component on the printed circuit board and electrical contact-making of the component). The windings are mounted in supported and helical fashion on the printed circuit board in the plane of the printed circuit board or are in the form of correspondingly running conductor tracks. In one configuration of the helical windings in the form of conductor tracks, the windings can be produced in the same step as the formation of the remaining conductor tracks of the circuit of the starting and control device. Windings formed in such a way form a flat helical coil, in which the turns can be etched out of a conductive layer of the circuit board, for example. Cores of the transformer and inductance windings are preferably in the form of planar-type cores and are realized by cutouts in the printed circuit board. Separate cores can be arranged in the cutouts. In terms of thermal technology, it is particularly interesting if the core or cores is/are in contact with the housing of the combined starting and control device. Thus, the heat forming in the region of the cores can be dissipated towards the outside effectively via the metal, in particular aluminum, housing. In this case, the housing to a certain extent acts as a heat sink for the cores of the transformer and inductance windings. In this way, the operating temperature in the interior of the housing of the combined starting and control device can be reduced.

The size of the combined starting and control device can be further reduced by virtue of the fact that the electronic circuit of the starting and control device is designed using microtechnology or thick-film hybrid technology. The space required for the combined starting and control device can thereby be further reduced. In this case, the aim is to extend the permissible ambient temperature range whilst at the same time providing systems miniaturization and as a result optimum utilization of the available physical space.

The lighting device according to the invention can be in the form of any desired motor vehicle lighting device, for example in the form of a headlamp, tail lamps or other signal lamps. It is particularly preferred, however, for the lighting device to be in the form of a headlamp.

Advantageous embodiments and particular advantages of the present invention will be explained below with reference to the figures, in which.

Figure 2:
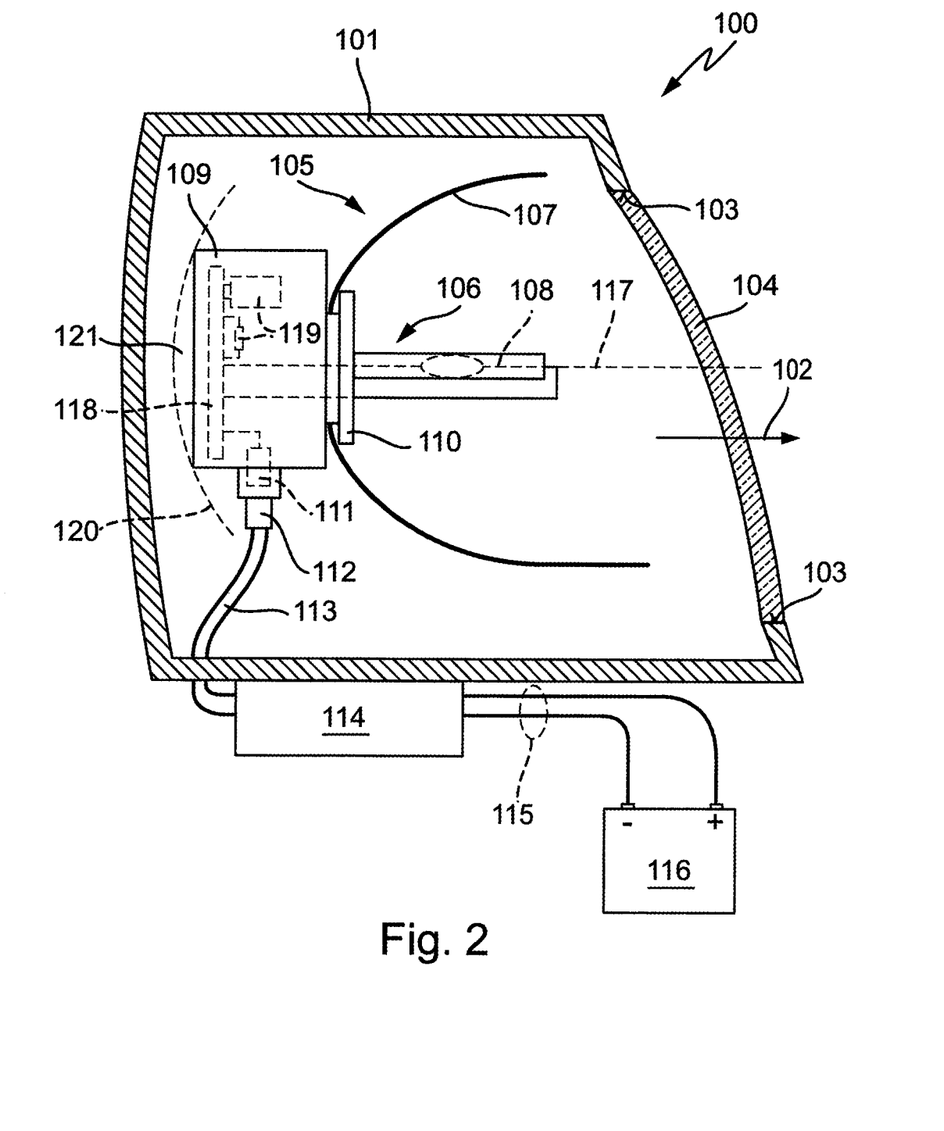
FIG. 2 shows a lighting device known from the prior art.

In FIG. 2, a lighting device known from the prior art in the form of a motor vehicle headlamp is denoted in its entirety by the reference symbol 100.

The lighting device 100 comprises a housing 101, which is preferably manufactured from plastic. The housing 101 has a light exit opening 103, which is closed by an optically transmissive cover plate 104, in the light exit direction 102. The cover plate 104 is preferably in the form of a clear plate. However, it is also conceivable for the cover plate 104 to have optically effective profiles (not illustrated), for example in the form of lenses, prisms or the like, in particular for diffusing the light which is passing through.

A light module 105 which has a light source 106 and a reflector 107 is arranged in the interior of the housing 101. The light module 105 can be mounted in one or more supporting frames in the headlamp housing 101 in such a way that it is pivotable in the horizontal and/or vertical direction. In the exemplary embodiment illustrated, the light source 106 is in the form of a gas discharge lamp with a glass bulb 108, which is filled with a noble gas (for example xenon) and in which an arc is formed, and with an integrated starting device 109, which generates the high voltage required for striking the arc in the glass bulb 108, which high voltage is in the region of approximately 25 000 V, for example. The starting device 109 can be fastened to the lamp base either undetachably (for example D1 or D3 lamp) or detachably (for example D2 or D4 lamp). A plate-shaped lamp base 110 is formed between the starting device 109 and the glass bulb 108 and is used to fasten the light source 106 on the reflector 107. The fastening of the lamp base 110 on the reflector 107 is illustrated in simplified form in FIG. 2. This generally takes place via a substantially hollow-cylindrical reflector neck, which is formed on the rear side of the reflector 107 and into which the base 110 is inserted. Conventionally, fastening means for fastening the light source 106 in a predetermined position relative to a reflective surface of the reflector 107 are formed on the inner circumferential side of the reflector neck, said fastening means not being explained in any more detail here, however.

The light module 105 illustrated in FIG. 2 is denoted as a reflection module since the desired light distribution is generated by the light emitted by the light source 106 and reflected by the reflector 107 alone, possibly under the influence of optically effective profiles on the cover plate 104. In this case, the reflector 107 is preferably in the form of a free-form reflector, which can be used to generate the desired light distribution with and without the light-dark boundary without any additional covering diaphragms and optically effective profiles on the covering plate 104.

Apart from the components illustrated in FIG. 2, namely the light source 106 and the reflector 107, the light module 105 can also have a projection lens (not illustrated), which projects the light beams emitted by the light source 106 and reflected and focused by the reflector 107 onto the roadway in order to generate a desired light distribution in front of the motor vehicle. If the desired light distribution is intended to have a horizontal light-dark boundary, a diaphragm arrangement with an approximately horizontally running upper edge can be provided approximately at the height of the optical axis 117 of the reflector 107 or directly therebelow between the reflector 107 and the projection lens. Such light modules are referred to as projection modules.

An electrical plug-type element 111 in the form of a plug is provided on the lower side of the starting device 109. A corresponding plug-type element 112 in the form of a socket is in engagement with the plug-type element 111. An electrical contact is produced between the electrical components of the starting device 109 and a shielded cable 113 via the plug-type elements 111 and 112, said cable running to a control device 114 arranged outside of the headlamp housing 101. The control device 114 for its part is connected via the cable 115 to an energy source 116 of the motor vehicle power supply system. The control device 114 controls the starting device 109 and forms an input voltage for the starting device 109 which is approximately in the region of 1000 V, for example, from the vehicle power supply system voltage (for example 6 V, 12 V, 24 V). The starting device 109 generates the high voltage (for example 25 000 V) required for striking the arc in the glass bulb 108 from this voltage. In addition, the control device 114 makes available the operating voltage, which is likewise formed from the vehicle power supply system voltage, for the steady-state operation of the light source 106. During normal, steady-state operation of the light source 106, i.e. after successful striking of the arc, the starting device 109 is simply switched on.

The lighting device 100 with the external control device 114 is inserted into an installation space in the motor vehicle provided for this purpose and is fastened there on the motor vehicle chassis. One disadvantage with the known lighting devices 100 is the fact that the installation space needs to accommodate not only the headlamp housing 101, but also the control device 114 fastened thereto and needs to be designed to be correspondingly large. In addition, the mounting process for the known lighting devices 100 is involved since the control device 114 needs to be arranged on the outer side of the headlamp housing 101 and fastened thereto. In addition, the shielded cable 113 needs to be passed through an opening in the housing 101 and connected to the starting device 109 by means of the plug elements 111 and 112. Finally, the cable 113, which is shielded for reasons of improved electromagnetic compatibility, is relatively expensive.

The starting device 109 has a conventional rigid printed circuit board 118 (illustrated by dashed lines) in the interior, with conductor tracks conventionally being applied to said printed circuit board and electrical components, such as the electrical components 119 illustrated by way of example (coils, capacitors, resistors, etc.), being applied and contact being made with said components on said printed circuit board. The starting device 109 conventionally comprises a leadframe (stamped conductors embedded in an insulating material, for example plastic) as a component mount. The components 119 are fastened thereto and contact is made with said components thereon. In addition, the printed circuit board 118 is populated with a plug element 111 in the form of a conventional plug-type system. The printed circuit board 118 conventionally comprises a rigid electrically insulating substrate, to which the conductor tracks and the contact-making points for the electrical components 119, 111 are applied by means of mask-etching. In the starting devices 109 of the known lighting devices 100, exclusively single-layered leadframe component mounts are used, in which conductor tracks are applied and components 119, 111 are arranged only on one surface side. In the known starting devices 109, the physical space which is available in the interior of the starting device is not used in optimum fashion.

During operation of the lighting device 100, the greatest amount of heat is emitted from the light source 106 or from the arc formed in the glass bulb 108. The heat emitted results in considerable heating of the reflector 107, which is made either from metal, for example diecast aluminum, or from a heat-resistant plastic with a reflective coating, for example a metal coat. In order to improve the EMC properties of the starting device 109, said starting device has a shield made from metal, preferably from sheet aluminum, which is in electrically conductive and therefore also in thermally conductive contact with the rear side of the reflector. Disadvantageously, a large proportion of the heat is transmitted from the reflector 107 to the shield of the starting device 109 and therefore indirectly onto the printed circuit board 118 arranged therein and the electrical components 119, 111 via said contact-making connection. This may result in very high thermal loads being placed on the printed circuit board 118 and the electrical components 119, 111 in the interior of the starting device 109. As a consequence, this either leads to premature ageing, a functional fault and ultimately to a defect in the printed circuit board 118 and the components 119, 111 or else particularly heat-resistant printed circuit boards and electrical components need to be used, which are relatively expensive, however.

With the lighting devices 100 known from the prior art, the starting device 109 generally has a rectangular shape. The outer walls of the starting device 109 are all substantially flat, with adjacent walls being positioned at a right angle with respect to one another, apart from relatively small rounded portions in the region of the edges and corners of the starting device housing. In this case, it is not possible to make mention of optimum use of the space available in the interior of the headlamp housing 101 by the light module 105, in particular by the starting device 109 of the light source 106 of the light module 105. In the prior art, the opposite is more the case. Thus, the strictly angular shape of the starting device 109, for example, results in the region covered by the starting device 109 (in FIG. 2 the path covered in the event of vertical adjustment of the light module 105 is denoted by the reference symbol 120) being greater than is actually required during pivoting of the light module 105 for the purpose of headlamp beam adjustment and/or for the purpose of implementing a cornering light function. An unused region 121 is located between the rear wall of the housing and the movement path 120 on the rear side of the housing of the starting device 109.

As a result, however, the housing 101 of the lighting device 100 necessarily also has larger dimensions than are actually required. By virtue of a suitable configuration of the shape of the starting device 109, the psychical space which is required in the interior of the headlamp housing 101 for the light module 105 could be reduced and thus the entire lighting device 100 can be provided with a smaller design. In this case, a smaller installation space would need to be provided in the motor vehicle, with the result that there would more space available for the remaining assemblies in the front region of the motor vehicle, in particular in the engine compartment. This is of significance in particular as regards the fact that motor vehicles are provided with an increasing number of functions for which additional assemblies or components often need to be arranged in the engine compartment. Optimum use of the space available in the engine compartment is an increasingly common demand.

Figure 1:
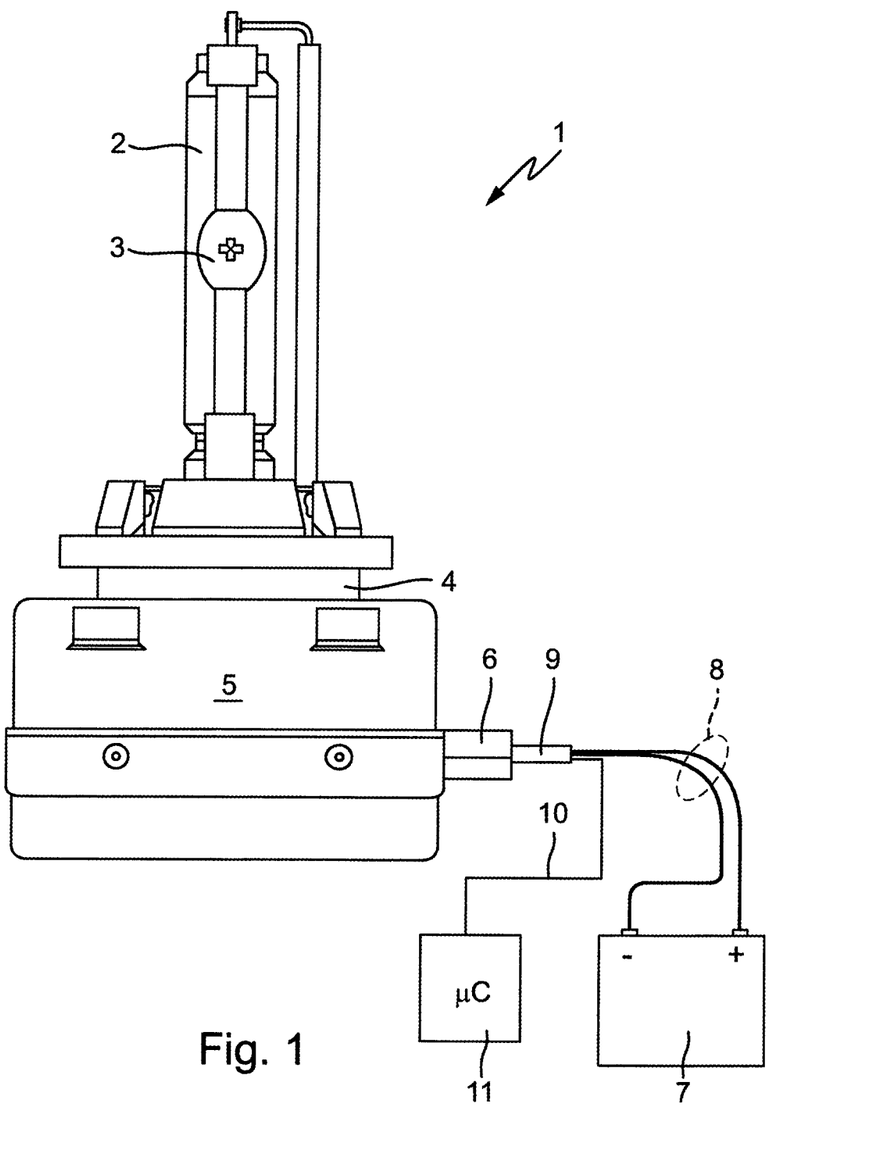
FIG. 1 shows a gas discharge lamp of a lighting device according to the invention.

FIG. 1 shows a gas discharge lamp 1 of a lighting device according to the invention, preferably a headlamp. The gas discharge lamp 1 is fastened on a reflector and arranged in the housing of the lighting device, in a similar manner to the gas discharge lamp 106 of the known lighting device 100. The gas discharge lamp 1 comprises a glass bulb 2, which is filled with noble gas and in whose interior 3 an arc for emitting light which is visible to the human eye is struck and maintained. The gas discharge lamp 1 can be arranged on the reflector neck of a reflector of the lighting device according to the invention via a lamp base 4 and can be fastened on said reflector neck. In this case, the reflector surrounds the glass bulb 2 in a manner similar to that illustrated in FIG. 2. A combined starting and control device 5, which is an integral part of the light source 1, i.e. is connected undetachably to the base 4, is arranged on that side of the lamp base 4 which is opposite the glass bulb 2.

In the case of the gas discharge lamp 1, the control device functionality which was fulfilled in the prior art by the external control device 114 has therefore been integrated in the starting device. Preferably, all of the electronic components for implementing both the control device functionality and the starting device functionality are accommodated within a single housing of the combined starting and control device 5. This has the advantage that it is possible to dispense with the arrangement of a separate control device outside of the housing of the lighting device. Thus, the use of a shielded cable for electrically connecting the control device to the starting device is also no longer required. The lighting device according to the invention can be fitted in a simpler manner and more quickly than the previously known lighting devices. In addition, the lighting device according to the invention requires less space in the motor vehicle, with the result that the installation space required for the lighting device in the motor vehicle can be provided with smaller dimensions. There is therefore more space available for other components and assemblies in the front region of the motor vehicle.

The combined starting and control device 5 has a plug element 6 in the form of a plug. An energy source 7 of the motor vehicle power supply system is connected via cables 8 and a further plug element 9 in the form of a socket via the plug element 6 to the combined starting and control device 5. Not only power supply lines 8, but also drive and/or signal lines 10 can be connected to the combined starting and control device 5 via the plug elements 6, 9. For example, drive signals can be transmitted from a superordinate motor vehicle control device 11 to the starting and control device 5 of the light source 1 via a drive line 10. Likewise, feedback relating to the functioning and the operation of the gas discharge lamp 1 can be transmitted to the superordinate control device 11 via line 10 or another signal line.

Various measures are conceivable for the particularly advantageous configuration of the integration of the control device functionality in the starting device of the gas discharge lamp 1. One aspect is, for example, particularly efficient utilization of the space available in the housing of the combined starting and control device 5 for the electrical components required for implementing the starting and control device functionality. In addition, thermal aspects can be taken into consideration in order to prevent premature ageing of the electrical components of the combined starting and control device 5 and/or to make the use of less expensive, i.e. less heat-resistant components possible. Finally, by virtue of particular measures, the physical space available in the interior of the housing of the lighting device for the light module can be used particularly efficiently in order that the housing of the lighting device can be designed to be no larger than previously, preferably even smaller, despite the integration of the control device functionality in the starting device.

Figure 3:
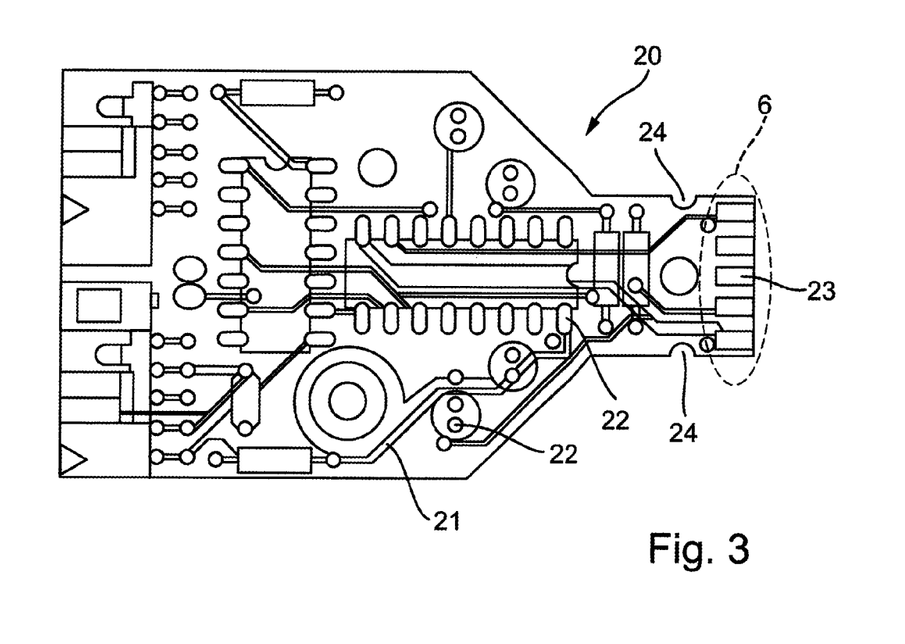
FIG. 3 shows a plan view of a printed circuit board of a combined starting and control device of a lighting device according to the invention.

FIG. 3 shows an example of a printed circuit board 20, as is used in the combined starting and control device 5 of the lighting device according to the invention. The printed circuit board 20 has a large number of conductor tracks 21 and contact-making points 22 for electrical components. As electrical components it is possible to arrange, for example, integrated circuits (IC1, IC2), resistors (R1, R2, R3, R4), capacitors (C5, C6, C7, C8) and coils. A plurality of contact points 23 arranged next to one another are formed on the right-hand side of the printed circuit board 20 shown in FIG. 3, with some of the conductor tracks 21 being guided to some of the contact points 23. The contact points 23 form the electrical contacts of the plug element 6. With the plug-type connector type described, the contacts 23 of the plug are therefore to a certain extent formed by the conductor tracks of the printed circuit board 20. In order to realize the plug element 6, therefore, it is not necessary for any additional space-consuming electronic components to be arranged on the printed circuit board 20 and for contact to be made with said components. The plug element 6 is to a certain extent an integral part of the printed circuit board 20. The physical space required for the plug element 6 and the space for connecting the plug element 6 on the printed circuit board 20 can be markedly reduced by the embodiment described with reference to FIG. 3.

The contact points 23 can be applied to the printed circuit board 20 in the same way as the conductor tracks 21 and the contact-making points 22. A mask etching process is suitable for this purpose, for example. The mechanical connection to the plug-type connector element 9 (socket part) is ensured by appropriate milled portions in the contour of the printed circuit board 20. It is thus conceivable, for example, for resilient latching tabs of the socket part 9 which has been plugged onto the plug part 6 to engage in cutouts 24 in the printed circuit board contour and to hold the socket part 9 in this way detachably on the plug-type connector part 6, with the result that the plug-type connection itself does not become detached unintentionally in the event of vibrations during operation of the motor vehicle.

Figure 4:
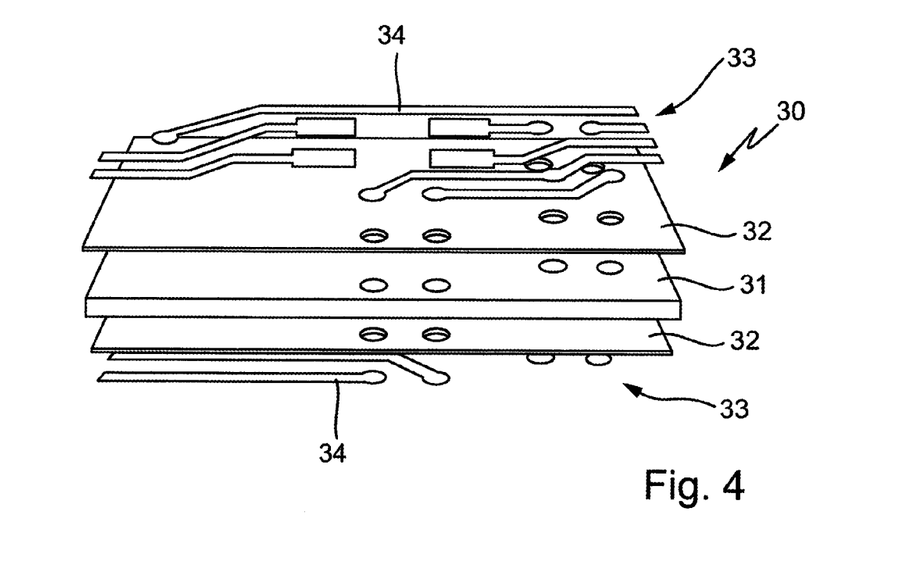
FIG. 4 shows an exploded illustration of a printed circuit board of a combined starting and control device of a lighting device according to the invention.

A further measure for the efficient utilization of the physical space available in the housing of the combined starting and control device 5 can be achieved, for example, by virtue of the fact that a multilayered printed circuit board is used instead of a single-layered printed circuit board, on which conductor tracks are formed and electrical components are arranged on only one side. FIG. 4 shows, by way of example, a two-layered printed circuit board 30, which has a carrier layer 31 consisting of an insulating material, for example a ceramic or silicon substrate. Additional thin insulating layers 32 can be applied to both sides of the carrier layer 31. It is of course conceivable for the function of the insulating layers 32 to be integrated in the carrier material 31 given correspondingly suitable insulating properties of the carrier material 31, i.e. to dispense with the separate insulating layers 32. Finally, a thin layer 33 of conductive material is applied to both sides of the carrier layer 31, with part of the conductive material being removed in order to form the conductor tracks 34, for example by means of a mask-etching process. Of the layer 33, now only the conductor tracks and contact-making points shown in FIG. 4 remain in this case. The use of a multilayered printed circuit board, such as the double-sided printed circuit board 30 shown in FIG. 4, for example, has the advantage that in practice a multiple of conductor tracks and electrical components can be arranged on the same printed circuit board area. As a result, considerable savings can be made as regards the physical space required.

Figure 5:
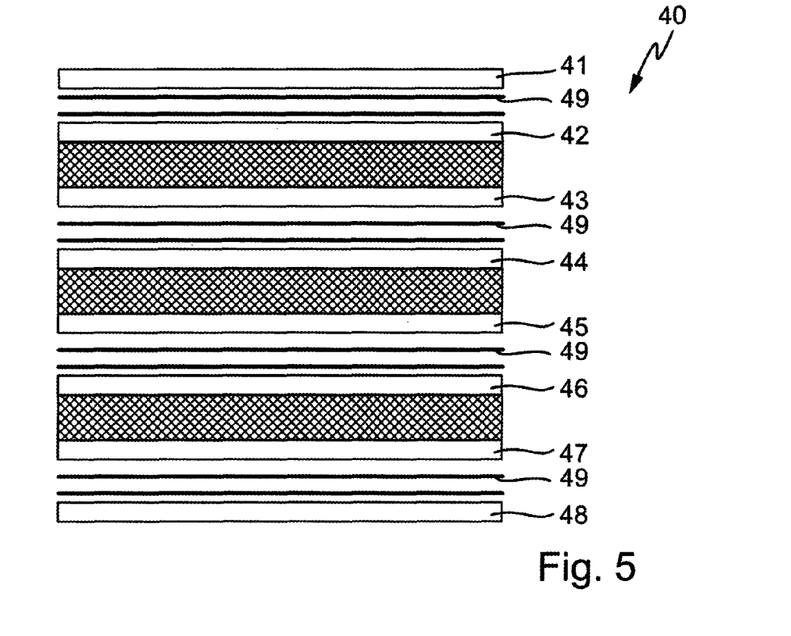
FIG. 5 shows a sectional view through a printed circuit board of a combined starting and control device of a lighting device according to the invention.

FIG. 5 shows a multilayered printed circuit board 40 (so-called multilayer PCB) with in total eight layers. The various layers of the printed circuit board 40 are denoted by the reference symbols 41 to 48. The conductor tracks 49 can be formed between the various layers 41 to 48, with the conductor tracks 49 of different layers naturally needing to be separated from one another by suitable insulating layers (not illustrated in FIG. 5). In addition, the electronic components of the combined starting and control device 5, such as integrated circuits (ICs without dedicated housing and only as a silicon chip), capacitors and resistors, for example, can be integrated in the interlayers 42 to 47 of the printed circuit board 40. As a result, considerably more components can be accommodated than previously, based on a given printed circuit board area.

Figure 6:
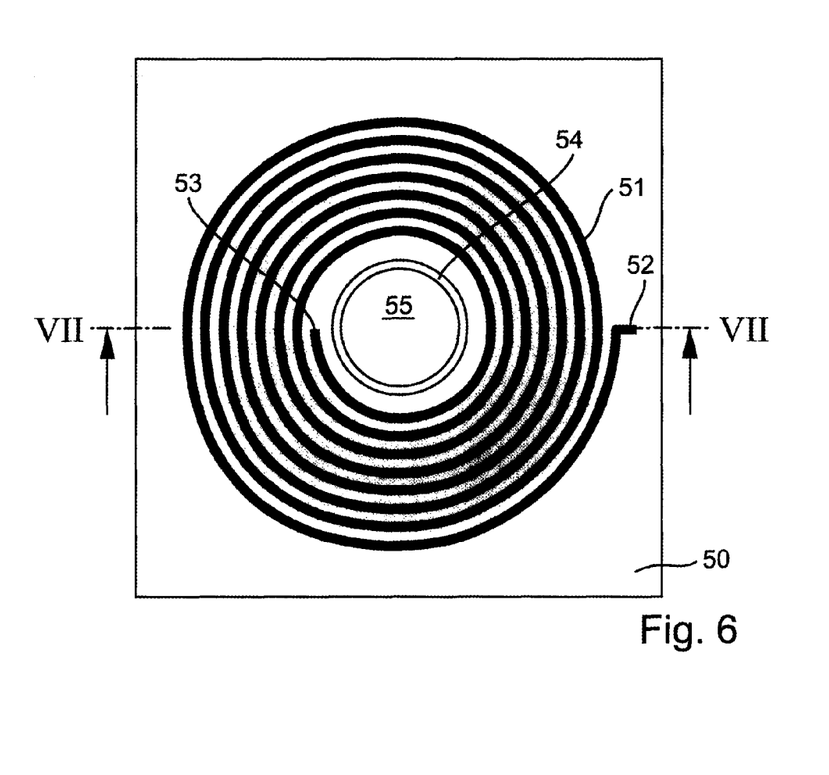
FIG. 6 shows a plan view of part of a printed circuit board of a combined starting and control device of a lighting device according to the invention.

Further potential for reducing the physical space required for assemblies required for implementing the starting and control device functionality results by virtue of the fact that transformer and inductance windings which are required for the circuit are mounted in supported and helical fashion on the printed circuit board or are in the form of conductor tracks on the printed circuit board. A corresponding exemplary embodiment of a transformer and inductance winding is illustrated in FIG. 6. The printed circuit board is denoted by the reference symbol 50. The transformer or inductance winding which is applied to the printed circuit board 50 in helical fashion in the form of a conductor track is denoted by the reference symbol 51. The winding 51 has two terminals 52 and 53 at the start and at the end of the conductor track 51. The terminal 53 is guided through the printed circuit board 50 onto the rear side of the printed circuit board 50, where contact is then made with said terminal via a conductor track running there (cf. FIG. 7). Contact can be made with the terminal 52 on that side of the printed circuit board 50 shown in FIG. 6.

Figure 7:
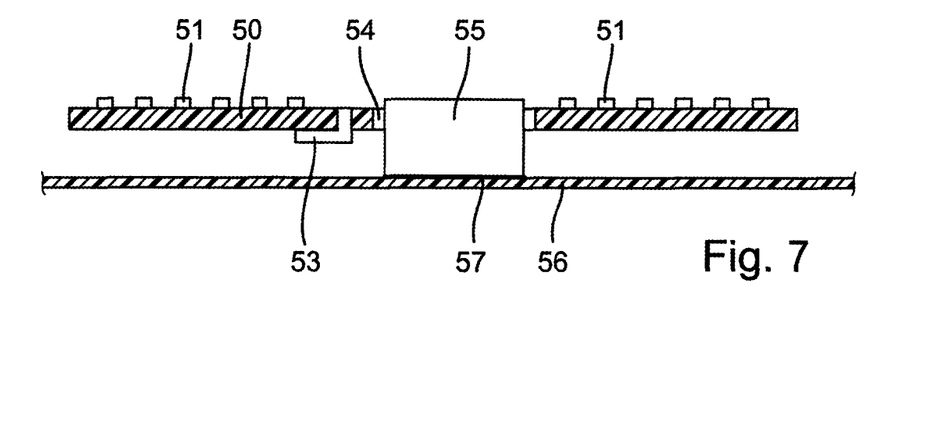
FIG. 7 shows a sectional view through the printed circuit board detail shown in FIG. 6 along the line VII-VII from FIG. 6.

FIG. 7 shows a cross section through the printed circuit board 50 along the line VII-VII in FIG. 6. A cutout 54 in the printed circuit board 50, in which cutout a core 55 is arranged, is formed in the center of the helical winding 51. The core 55 is connected to the housing 56 of the combined starting and control device 5. In this way, heat which is produced in the core 55 during operation of the starting and control device 5 can be emitted efficiently to the metal housing 56, which acts as a type of heat sink. Alternatively, the core can also be in the form of a planar-type core and be implemented by cutouts in the printed circuit board 50. In this embodiment, too, the soft-magnetic material (for example ferrite, iron powder, etc.) forming the core can be connected to the housing 56 for improved heat dissipation. Means 57 for improving the heat transfer between the core 55 and the housing 56 can be formed between the core 55 and the housing 56 of the combined starting and control device 5. Such means 57 are, for example, a particularly effective thermally conductive paste or coating. It is therefore advantageous if the entire circuit of the combined starting and control device 5 is designed using microtechnology or thick-film hybrid technology, with it being necessary to take measures for optimized thermal economy in the housing 56 of the starting and control device 5 owing to the high degree of development of heat.

It is conceivable to design primary and secondary windings of a transformer to be in different layers of the component mount. As a result of a plurality of windings one above the other in various layers or in the form of a wire winding on the printed circuit board surface, a transformer or a coupled inductance can be realized.

Other measures, apart from the ones already mentioned, for optimizing the circuit of the starting and control device 5 in terms of heat are, for example, an arrangement of heat-sensitive electrical components in regions of the circuit which are subjected to a less severe thermal load. Heat-sensitive components are placed in a targeted manner in relatively cool regions of the starting and control device 5. Components with a high level of heat emission are arranged so as to be far removed from the sensitive components in regions which provide good dissipation of the heat. Relatively cool areas can either be regions in which components with a low power loss are positioned or regions with a supply of cooling air. The positioning of the individual components of the circuit of the starting and control device 5 in the housing 56 therefore takes place depending on the temperature sensitivity of the components and on the local operating temperature at the various positions in the housing 56. The local operating temperature in the housing 56 can either be determined by practical measurements or simulated. After corresponding positioning of the components, the profile of the conductor tracks can be determined in order to make proper contact with the positioned components, if possible without the intentionally selected position of the components being changed, however.

In addition, the electrical components of the circuit can be arranged in a targeted manner in the housing 56 in such a way that an air flow is achieved using temperature gradients in the housing 56, which air flow in particular flows past thermally critical components and cools said components. In addition, the topology of the housing 56 of the starting and control device 5 can be designed in such a way that the free cooling air flow is not impaired or impeded, if possible. This can be achieved, for example, by topologies with a low air resistance and little air turbulence.

Figure 8:
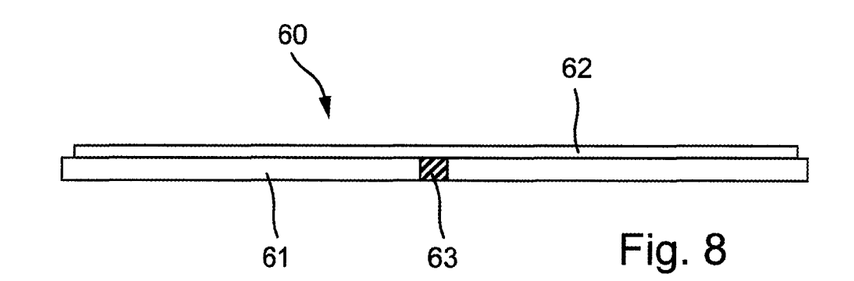
FIG. 8 shows a further example of a printed circuit board of a combined starting and control device of a lighting device according to the invention prior to the milling of a groove into the printed circuit board.

The utilization of the space available in the housing 56 of the combined starting and control device 5 can be further optimized by virtue of the fact that one particular flexible printed circuit board is used instead of one or more flat printed circuit boards. An example of such a printed circuit board is described in more detail with reference to FIG. 8 and FIG. 9. A conventional, preferably rigid printed circuit board 60 which has a substrate 61 as the carrier material is used as a basis. A conductive layer 62 is formed on the carrier material 61, from which conductive layer the conductor tracks are formed, for example by means of a mask-etching process. Now, a groove 63 is introduced, for example milled, into the carrier material 61 of the printed circuit board 60. The material of the substrate 61 removed in the process is illustrated by hatching in FIG. 8. When the groove 63 is introduced into the carrier material 61, it is necessary to take care that at least the conductive layer 62, if necessary for stability reasons also part of the carrier material 61, remains in order to prevent the printed circuit board 60 from breaking apart when populated, when installed in the housing 56 or during operation of the motor vehicle as a result of vibrations or shocks.

Figure 9:
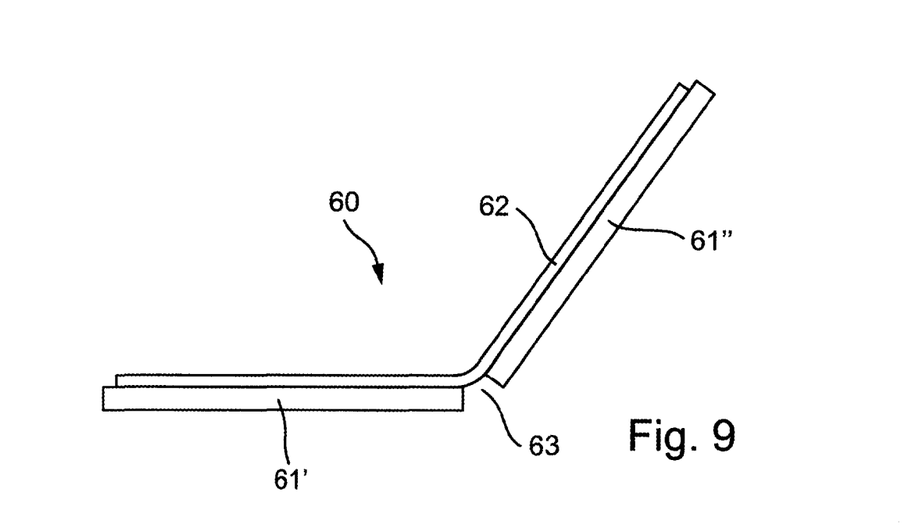
FIG. 9 shows the printed circuit board shown in FIG. 8 after the milling of the groove.

Then, the printed circuit board 60 can be bent back along a bending edge formed by the groove 63, as is illustrated in FIG. 9, for example. In the process, the conductive layer 62 or the conductor tracks formed therefrom and possibly also the remaining part of the carrier material 61 take on the function of a hinge about which the printed circuit board can be bent. It can be seen from the exemplary embodiment illustrated that the previously integral carrier material 61 of the printed circuit board 60 is now split by the groove 63 into two pieces 61' and 61" which can be pivoted relative to one another about the groove 63.

It is of course possible to introduce more than one groove 63 into a rigid printed circuit board, which grooves can run parallel or obliquely to one another. In this way, the printed circuit board 60 can be divided into a plurality of parts, which can be pivoted relative to one another in a two-dimensional plane (in the case of parallel grooves) or even in a three-dimensional space (grooves at an angle or skewed with respect to one another). In this way, virtually any desired three-dimensional structures can be achieved with the printed circuit board 60. As a result, the printed circuit board 60 can be fitted in optimum fashion into the interior of the housing 56 of the combined starting and control device 5. The fact that the printed circuit board is a rigid, i.e. particularly dimensionally stable printed circuit board which is capable of changing its shape at specific points by virtue of particular measures (the introduction of a groove 63 into the substrate 61 of the printed circuit board 60), is decisive for the stability of the printed circuit board 60.

Figure 10:
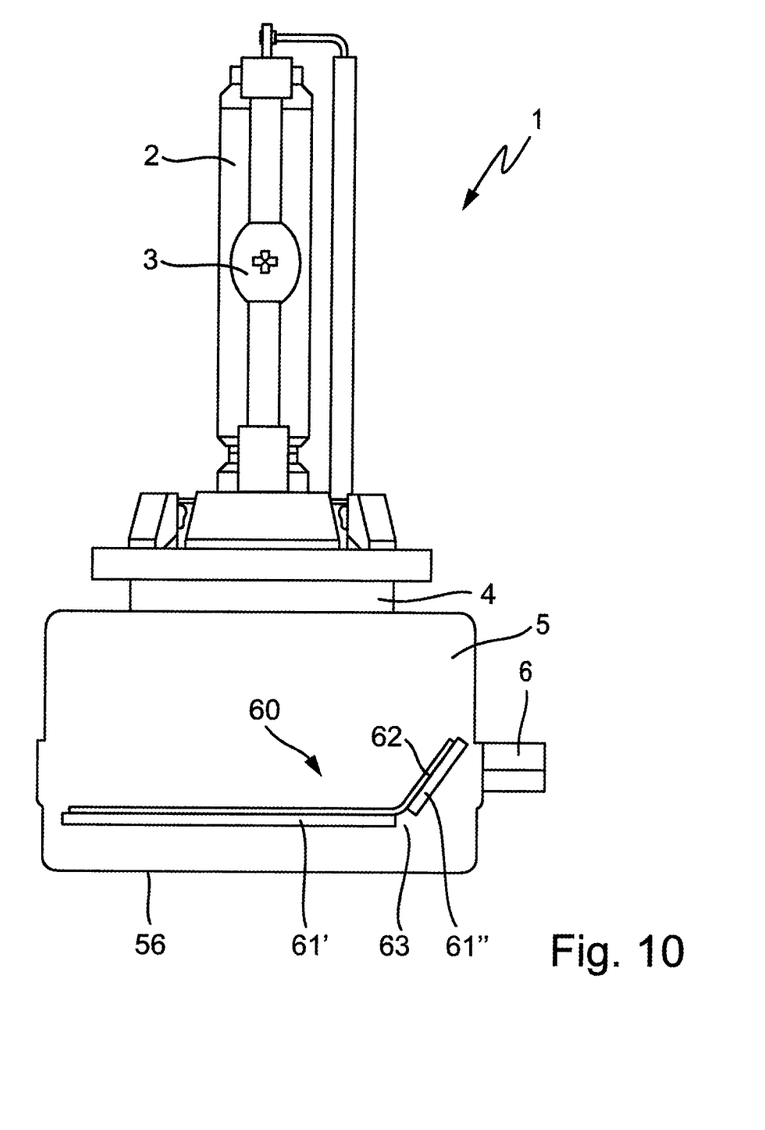
FIG. 10 shows a gas discharge lamp with a combined starting and control device with a printed circuit board as shown in FIG. 9 arranged therein.

FIG. 10 shows a gas discharge lamp 1 corresponding to that shown in FIG. 1. In this case, the combined starting and control device 5 is illustrated partially in section, with the result that the flexible printed circuit board 60 in the housing 56 can be seen better. It is immediately apparent that a good compromise has been found with respect to the particularly stringent requirement in motor vehicles for the stability of the printed circuit board 60, on the one hand, and with respect to optimum utilization of the interior of the housing 56 of the starting and control device 5, on the other hand, by virtue of the rigid printed circuit board 60, which is nevertheless flexible in the region of the grooves 63. This applies in particular to multiply flexible printed circuit boards 60, in particular for printed circuit boards 60 which can be deformed in the three-dimensional space.

It is of course also possible for the flexible printed circuit board 60 to be used in combined starting and control devices 5 in any desired other motor vehicle control devices as well. Thus, the use of the printed circuit board 60 according to the invention in a control device for semiconductor light sources (LEDs) of lighting devices is in particular envisaged.

Figure 11:
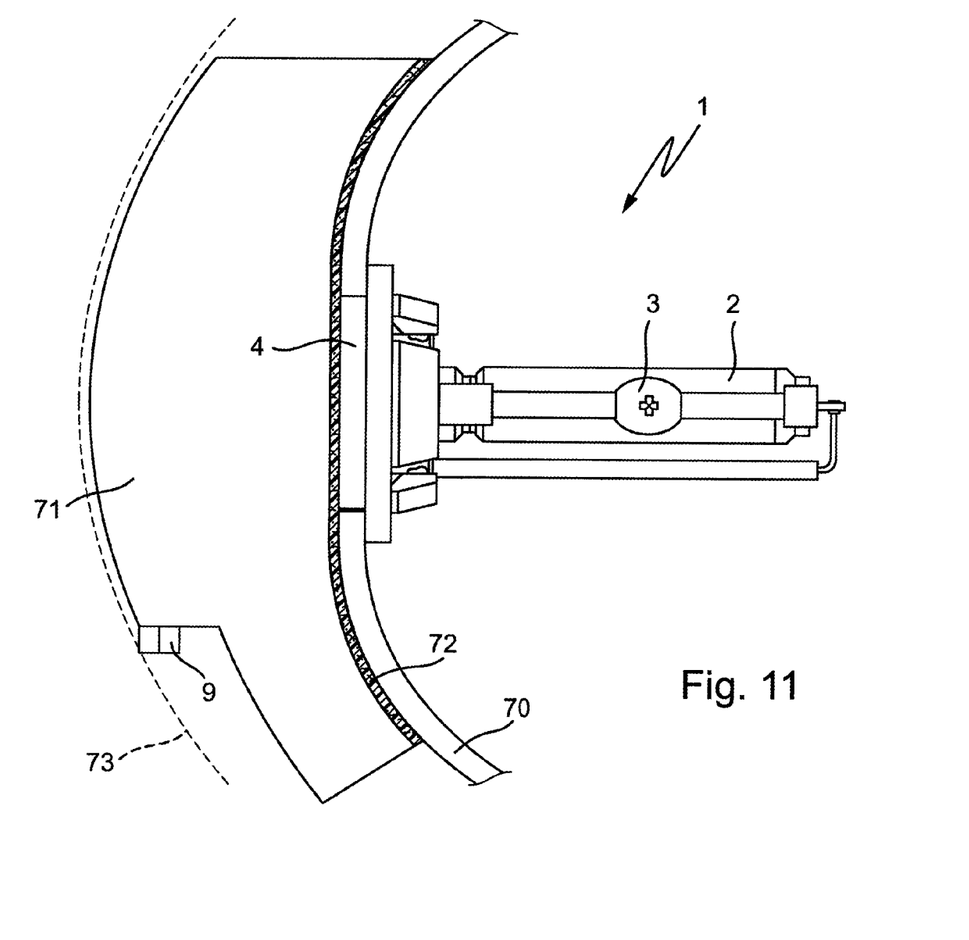
FIG. 11 shows a side view of a detail of a lighting device according to the invention, comprising a gas discharge lamp with an integrated combined starting and control device and part of a reflector.

In the lighting devices 100 known from the prior art with a gas discharge lamp 106, the starting device 109 is arranged at a distance from the rear side of the reflector 107. In addition, said starting device only extends over a subregion of the rear side of the reflector 107. As a result, a large amount of space is wasted in the interior of the headlamp housing 101, which could be better used in another way. In this case, the embodiment shown in FIG. 11 provides a good solution. Said figure shows a detail of a lighting device according to the invention in a side view. In particular, said figure illustrates part of a reflector 70, to which the gas discharge lamp 1 is fastened via the base 4 thereof. The housing 71 of the combined starting and control device 5 has a particular configuration. Firstly, that side of the housing 71 which points towards the reflector 70 is designed in such a way that it rests if possible over the entire area on the rear side of the reflector 70 when the gas discharge lamp 1 is fastened to the reflector 70. In particular in the inner region about the optical axis, the reflector 70 is designed to be virtually rotationally symmetrical, with the result that it is possible for the housing 71 to rest over the entire area on the rear side of the reflector 70, with it being possible for the lamp 1 to even still be replaced by the lamp 1 being turned about its lamp axis and the lamp being removed towards the rear (in the opposite direction to the light exit direction) as a result of the rotational symmetry. In this way, the space between the housing 71 of the starting and control device 5 and the reflector 70 is used in optimum fashion. In order to avoid excessive heating of the housing 71 by the reflector 70, which is directly subjected to the rays of heat emitted by the gas discharge lamp 1, a heat-insulating layer 72 consisting of a material with poor thermal conductivity, for example ceramic or another fill material of capacitors, for thermally insulating the starting and control device 5 from the hotter reflector 70 is arranged between the housing 71 and the rear side of the reflector 70. In this way, the space between the housing 71 of the starting and control device 5 and the reflector 70 can be used in optimum fashion without this resulting in the functionality of the circuit being impaired owing to high temperatures.

For the EMC shielding of the electromagnetic radiation towards the outside world, which electromagnetic radiation is produced by the combined starting and control device 71 and the gas discharge lamp 1, a capacitive coupling which is electrically conductive for radiofrequency signals can be provided between the starting and control device 71 and the reflector 70. This is therefore a high-resistance connection between the starting and control device 71 and the reflector 70. This can be achieved, for example, by a material with a high $\epsilon_r$ value (relative permittivity). Such a material is, for example, air or the insulating material conventionally used for capacitors (for example PEN (polyethylene naphthalate) or ceramic). In this case, the front side of the starting and control device 71 and the rear side of the reflector 70 are arranged at a short distance from one another with a large area of overlap, with the insulating material being arranged between the two surfaces. The thermally insulating material for thermally decoupling the starting and control device 71 and the reflector 70 can simultaneously be used as electrical insulating material for capacitively coupling the starting and control device 71 and the reflector 70.

A further aspect of the housing 71 of the starting and control device of the gas discharge lamp 1 of the lighting device shown in FIG. 11 can be considered to be the rear wall of the housing 71 which is rounded off in the form of a cylinder segment. In the event of a vertical adjustment of the light module, the rear wall of the housing 71 moves on a circular path 73. The rear wall is rounded off in such a way that it runs precisely on or slightly within the path 73. This means that a cylinder axis of the rear wall rounded off in the form of a cylinder segment is aligned approximately horizontally and runs through a center of motion of the adjusting movement of the light module. In this way, the space behind the starting and control device of the gas discharge lamp 1, i.e. the space between the rear wall of the housing 71 and the rear wall of the headlamp housing (not illustrated), can be utilized particularly efficiently. The rear wall of the headlamp housing can be shaped corresponding to the rear wall of the housing 71 and can be passed particularly tight against the rear wall of the housing 71. In this way, the installation space required for the installation of the lighting device into the motor vehicle can be designed to be particularly small, with the result that additional space for other assemblies and components can be provided in the front region of the vehicle.

Figure 12:
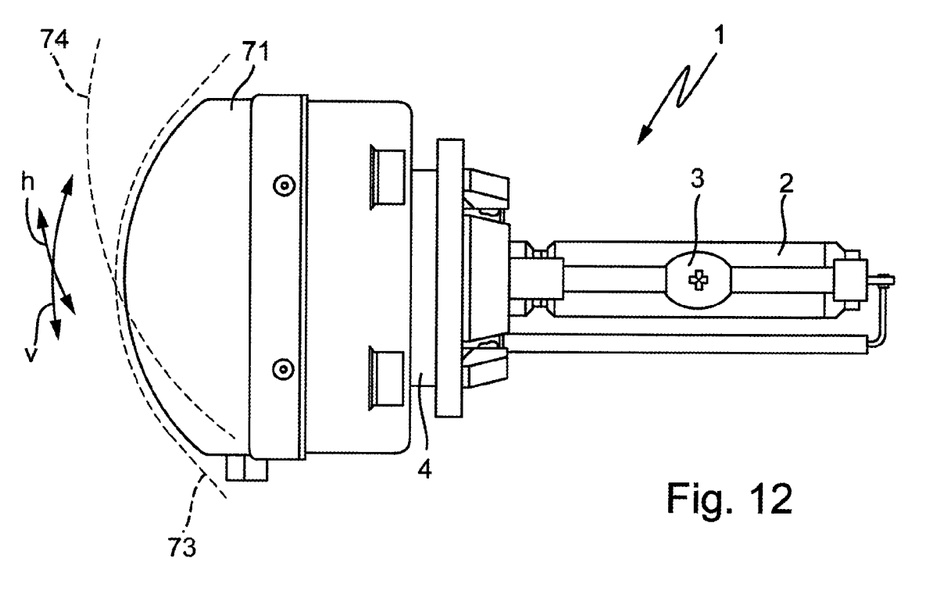
FIG. 12 shows a side view of a gas discharge lamp with an integrated, combined starting and control device of a lighting device according to the invention.

The embodiment shown in FIG. 11 has particular advantages in the case of a lighting device with headlamp beam adjustment, i.e. in which the light module can be adjusted in the vertical direction. If, in addition, a horizontal adjustment of the light module is also possible for implementing a cornering light function, a rear wall of the housing 71 of the combined starting and control device, which rear wall is curved in the form of a segment of a sphere, brings about particular advantages, as is shown in FIG. 12, for example. The circular path on which the rear wall of the starting and control device 71 moves in the event of a vertical adjustment v of the light module is denoted by the reference symbol 73. A circular path on which the rear wall of the starting and control device 71 moves in the event of a horizontal adjustment h of the light module is denoted by the reference symbol 74. The axes of rotation of the vertical adjustment v and the horizontal adjustment h preferably intersect one another at a point of intersection which is simultaneously the center of motion of the light module. A central point of the segment of the sphere of the rear wall of the housing 71 of the starting and control device is preferably precisely in the point of intersection between the two axes of rotation, for example in the center of the arc of the gas discharge lamp. In this way, the space required for the starting and control device in the interior of the headlamp housing is particularly small and the entire lighting device can be designed to be particularly compact. As a result, the installation space required for the installation of the lighting device into the motor vehicle can be designed to be particularly small, with the result that additional space for other assemblies and components can be provided in the front region of the vehicle.

By virtue of a particularly well thought out geometric configuration of the shape of the housing 71 of the combined starting and control device, the space which is available in the interior of the headlamp housing for the starting and control device can therefore be used particularly efficiently. The curved housing shapes of the starting and control device in the exemplary embodiments shown in FIGS. 11 and 12 can be utilized particularly efficiently by the use of printed circuit boards in accordance with the exemplary embodiments shown in FIGS. 8 to 10. The printed circuit board can be matched to the shape of the rear wall of the housing 71.

Figure 13:
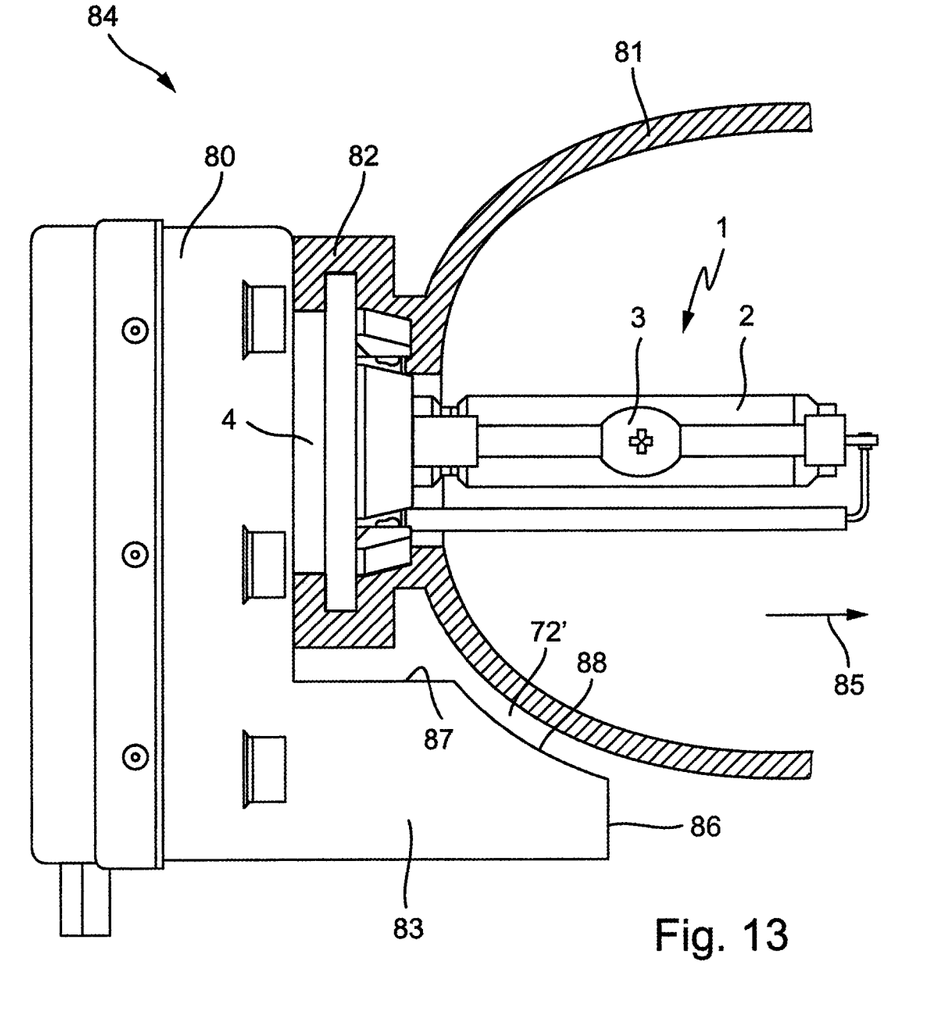
FIG. 13 shows a side view of part of a lighting device according to the invention, comprising a gas discharge lamp with an integrated, combined starting and control device and a reflector.

A further example of a particularly efficient use of the space available in the headlamp housing for the combined starting and control device 80 is illustrated in FIG. 13. The gas discharge lamp 1, as has already been explained, is fastened via its base 4 in a reflector neck 82 formed on the rear side of the reflector 81, in a defined position relative to the reflective surface on the reflector 81. In the case of conventional lighting devices (cf. FIG. 2), this results in a relatively large amount of unused space between the front wall of the housing of the starting and control device 80 and the rear wall of the reflector 81. This space can be used in the embodiment illustrated in FIG. 13 by virtue of the fact that the housing of the starting and control device 80 in the region of the front wall is extended at least partially about the reflector neck 82 towards the front in the direction of the reflector 81. In the exemplary embodiment illustrated, the front wall of the starting and control device 80 is moved beneath the reflector neck 82 in the direction of the reflector 81, with the result that the housing of the starting and control device 80 has an additional space 83 below the reflector neck 82, which additional space can be used for arranging printed circuit boards and/or electrical components of the starting and control device 80. In this way, there is more space available for the electronics in the interior of the housing of the starting and control device 80, without the dimensions of the light module 84 being enlarged. Only the physical space which is available in the light module 84 is used efficiently.

Preferably, at least one wall, which is directed towards the rear side of the reflector 81, of the additionally provided space 83 of the starting and control device 80 is matched at least approximately to the shape of the rear wall. This applies in particular to the wall 86 of the space 83 which is at the front in the light exit direction 85 and to the wall which is directed towards the reflector neck 82, in the exemplary embodiment the upper wall 87, of the space 83. In the exemplary embodiment illustrated, the connection between the front wall 86 and the upper wall 87 is designed to be sloping, the angle of the slope approximately corresponding to the profile of the rear wall of the reflector 81 in the corresponding region. It is of course conceivable for the connecting wall between the front wall 86 and the upper wall 87 to not be straight or flat, but to be curved, with the result that it runs equidistantly with respect to the rear wall of the reflector 81.

This embodiment can of course be combined with one of the preceding embodiments, in particular with the curved rear wall of the housing of the starting and control device in accordance with the embodiments shown in FIGS. 11 and 12.

FIG. 11 shows an exemplary embodiment in which the front wall of the combined starting and control device rests over the entire area on the rear wall of the reflector. The heat transfer from the reflector to the housing of the starting and control device and the high operating temperatures in the starting and control device associated therewith are critical here. For this reason, a thermally insulating layer is provided on the contact surface between the front wall of the housing of the starting and control device and the rear wall of the reflector in the exemplary embodiment shown in FIG. 11.

In order to improve the cooling of critical component parts of the light module, in particular of the housing of the starting and control device, temperature gradients can be utilized in a targeted manner for achieving a cooling air flow along the housing of the starting and control device. In this context, the topology of component parts of the light module can be designed in a targeted manner in such a way that the cooling air flow is not impeded. These are topologies with little air resistance and little air turbulence. If possible, the air flow should even be conveyed, by virtue of more air flowing in a specific region per unit time and/or the flow rate of the air flow being accelerated.

Figure 14:
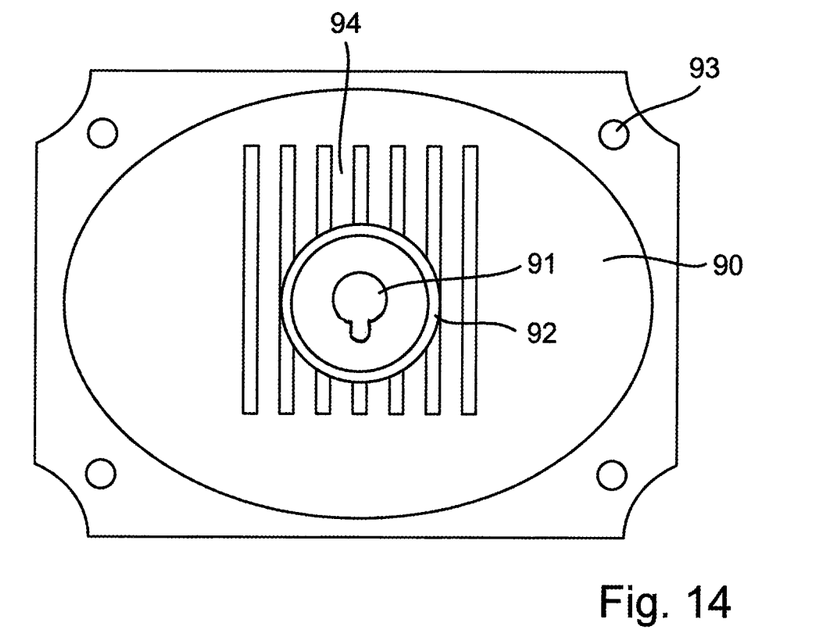
FIG. 14 shows a view in the light exit direction of the rear side of a reflector of a lighting device according to the invention.

FIG. 14 shows a rear side of a reflector 90. The reflector 90 has a central opening 91, through which the glass bulb of the gas discharge lamp is inserted into the reflector interior. The opening 91 is surrounded by a reflector neck 92, which protrudes towards the rear from the rear side of the reflector 90. Said reflector neck 92 serves the purpose of accommodating and fastening the lamp base of the gas discharge lamp. In addition, the reflector 90 has, at its front edge, fastening elements in the form of openings 93 for fastening a mount for a projection lens (not illustrated) of the light module, with the result that said projection lens is arranged downstream of the reflector 90, when viewed in the light exit direction.

A subregion of the rear side of the reflector 90 has air-guiding means 94, which can be in the form of a plurality of adjacently arranged ribs protruding from the rear wall of the reflector 90 and/or depressions let into the rear wall, for example. The region with the air-guiding means 94 corresponds to the region on which the front side of the housing of the starting and control device rests when the gas discharge lamp is fitted (cf. FIG. 11). Air channels are therefore formed by the air-guiding means 94 between the rear side of the reflector 90 and the front side of the supported starting and control device 95. Cooling air can flow via these channels and transports heat away from the reflector 90 or away from the housing of the starting and control device.

Figure 15:
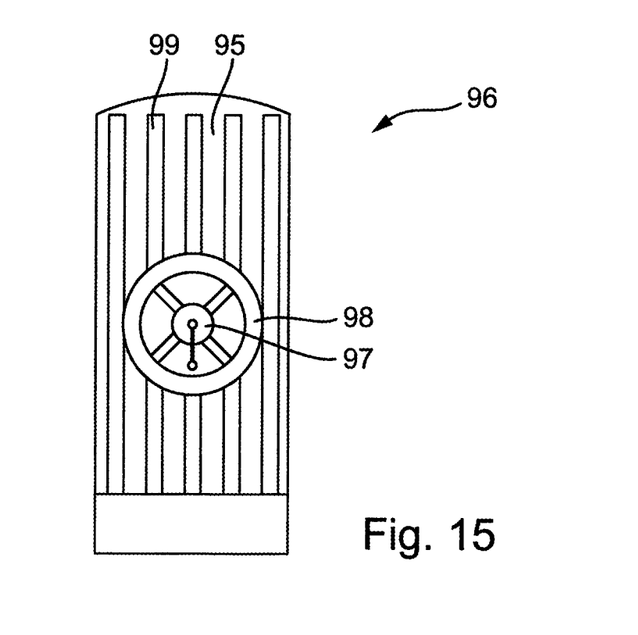
FIG. 15 shows a view in the opposite direction to the light exit direction of a gas discharge lamp with an integrated, combined starting and control device.

Of course the air-guiding means 94 do not necessarily have to be formed on the rear side of the reflector 90. FIG. 15 shows a gas discharge lamp 96 in a view from the front, i.e. from the opposite direction to the light exit direction. The lamp 96 comprises a glass bulb 97 filled with noble gas and a lamp base 98. The front side of the combined starting and control device 95 which is visible in FIG. 15 is designed in such a way that it rests if possible over the entire area on the rear side of the reflector when the lamp 96 is fitted on the reflector, or extends at a short distance with respect to said rear side. As an alternative or in addition to the air-guiding means 94 on the rear side of the reflector 90, air-guiding means 99 are arranged on the front side of the housing 95 of the starting and control device. These air-guiding means 99 are in the form of a plurality of adjacently arranged ribs protruding from the front side of the housing 95 and/or depressions let into the front side, for example.

Furthermore, it would be conceivable, in addition or as an alternative to the air-guiding means 94 and 99, to provide air-guiding means in a thermally insulating layer (for example the layer 72 in FIG. 11) between the front side of the housing 95 and the rear wall of the reflector 90. These air-guiding means can be in the form of a plurality of adjacently arranged ribs protruding from the front side of the housing 95 and/or depressions let into the front side, for example. In this embodiment, it would be conceivable for the front side of the housing 95 and/or the rear wall of the reflector 90 to be smooth, i.e. to be without the air-guiding means 94 and 99. In this case, the air-guiding means could be formed solely in the thermally insulating layer. A smooth configuration of the rear wall of the reflector 90 would have the advantage that standard reflectors could be used.

The shape of the air channels can also be selected in such a way that the cross section of the channels is reduced in the flow direction. As a result, the flow rate is increased and more heat can be transported away. A corresponding configuration of the ribs or depressions is readily possible.

Any desired combination of the mentioned exemplary embodiments is of course possible. The aim in this case is always practically suitable integration of the control device functionality in the starting device of a gas discharge lamp. In this case, particular consideration is given to the problems associated with space and temperature. However, these are in opposition with one another, i.e. the problems associated with temperature increase as the configuration of the starting and control device 5; 80 becomes increasingly compact.

The invention claimed is:

1. A lighting device for a motor vehicle comprising;
   gas discharge lamp for emitting light;
   a housing made from metal;
   a starting device for providing a starting voltage for starting the gas discharge lamp; and
   a control device for providing an input voltage for the starting device and an operating voltage for operation of the gas discharge lamp, the control device being combined with and an integral part of the starting device;
   wherein the combined starting and control has a plug element for connecting a vehicle power supply system voltage, the plug element being in the form of a printed circuit board plug, which is formed by conductor tracks guided at an edge of a printed circuit board of the starting and control device and the combined starting and control device is an integral part of the gas discharge lamp connected undetectably to a glass bulb and a lamp base of the gas discharge lamp, the gas discharge lamp and all of the electrical components for performing the starting device function and the control device function are accommodated within the housing in a multilayered printed circuit board, electronic components of the starting and control device circuit accommodated in interlayers of the printed circuit board.

2. The lighting device as claimed in claim 1, wherein the electronic components are in the form of integrated circuits without a dedicated housing, in the form of capacitors, resistors, transistors and/or diodes.

3. The lighting device as claimed in claim 2, wherein the combined starting and control device has a printed circuit board, and transformer and inductance windings are mounted in supported and helical fashion on the printed circuit board or are embodied as conductor tracks on the printed circuit board.

4. The lighting device as claimed in claim 3, wherein cores of the transformer and inductance windings are in the form of planar-type cores and are realized by cutouts in the printed circuit board.

5. The lighting device as claimed in claim 4, wherein the cores are in contact with a housing of the combined starting and control device.

6. The lighting device as claimed in claim 5, wherein the combined starting and control device is designed using micro technology or thick-film hybrid technology.

7. The lighting device as claimed in claim 6, wherein the lighting device is in the form of a headlamp.

* * * * *